US009657149B2

(12) United States Patent  
Keller

(10) Patent No.: US 9,657,149 B2  
(45) Date of Patent: May 23, 2017

(54) POLYVINYL ACETAL FILMS CONTAINING CYCLOHEXANE-1,2-DICARBOXYLIC ACID ESTERS AS A PLASTICIZER

(75) Inventor: Uwe Keller, Bonn (DE)

(73) Assignee: Kuraray Europe GmbH, Frankfurt am Main (DE)

( * ) Notice: Subject to any disclaimer, the term of this patent is extended or adjusted under 35 U.S.C. 154(b) by 969 days.

(21) Appl. No.: 12/991,570

(22) PCT Filed: May 8, 2009

(86) PCT No.: PCT/EP2009/055577  
§ 371 (c)(1),  
(2), (4) Date: Nov. 8, 2010

(87) PCT Pub. No.: WO2009/135928  
PCT Pub. Date: Nov. 12, 2009

(65) Prior Publication Data  
US 2011/0061714 A1 Mar. 17, 2011

Related U.S. Application Data

(60) Provisional application No. 61/098,363, filed on Sep. 19, 2008.

(30) Foreign Application Priority Data

May 8, 2008 (DE) .......................... 10 2008 001 655

(51) Int. Cl.  
C08J 5/18 (2006.01)  
B32B 17/10 (2006.01)  
C08K 5/11 (2006.01)  
C08K 5/12 (2006.01)  
H01L 31/048 (2014.01)

(52) U.S. Cl.  
CPC ........... C08J 5/18 (2013.01); B32B 17/10761 (2013.01); C08K 5/11 (2013.01); C08K 5/12 (2013.01); H01L 31/048 (2013.01); C08J 2329/14 (2013.01); Y02E 10/50 (2013.01)

(58) Field of Classification Search  
CPC ........ B32B 17/10761; C08J 5/18; C08K 5/11; C08K 5/12; H01L 31/048; C08L 29/14; Y02E 10/50  
USPC ................................. 136/243, 244, 251, 259  
See application file for complete search history.

(56) References Cited

U.S. PATENT DOCUMENTS 4,355,886 A * 10/1982 Perez et al. .................... 399/353  
5,019,624 A * 5/1991 Gutweiler et al. ............ 525/61  
5,326,796 A * 7/1994 LeCacheur et al. ........... 524/31  
6,559,212 B1 5/2003 D'Errico et al.  
6,801,652 B1 10/2004 Stanzl et al.  
6,982,296 B2 1/2006 Keller et al.  
7,312,275 B2 12/2007 Papenfuhs et al.  
7,358,304 B2 4/2008 Papenfuhs et al.  
7,511,096 B2 3/2009 Papenfuhs et al.  
7,528,192 B2 5/2009 Papenfuhs et al.  
7,786,201 B2 8/2010 Grass et al.  
2001/0046595 A1 * 11/2001 Moran et al. ................. 428/212  
2004/0015007 A1 1/2004 Grass et al.  
2004/0054220 A1 * 3/2004 Noe et al. ..................... 562/509  
2005/0131133 A1 6/2005 Wong et al.  
2006/0058439 A1 3/2006 Keller  
2006/0178446 A1 * 8/2006 Bedat et al. .................. 523/160  
2008/0185035 A1 * 8/2008 Hayes .......................... 136/251  
2010/0193024 A1 8/2010 Karpinski et al.  
2011/0136967 A1 * 6/2011 Mahling et al. .............. 524/570  
2011/0237744 A1 * 9/2011 Ren et al. ..................... 524/605

FOREIGN PATENT DOCUMENTS

| DE | 10116812 A1 | 10/2002 |
|---|---|---|
| DE | 10343385 A1 | 4/2005 |
| DE | 202006014595 U1 | 11/2006 |
| EP | 0185863 A1 | 7/1986 |
| EP | 0387148 A1 | 9/1990 |
| EP | 1235683 B1 | 8/2003 |
| JP | 08-048547 | 2/1996 |

OTHER PUBLICATIONS

Whelan, Polymer Technology Dictionary, Chapman & Hall, NEw York, NewYork, p. 181(1994).*  
Menzcel et al "Thermal Analysis of Polymers, Fundamentals and Applications", John Wiley & Sons, Inc. Hoboken New Jersey, pp. 344-345 (2009).*  
Peter A. Lewis "Pigment Handbook vol. I: Properties and Economics, 2nd Edition", John Wiley & Sons, New York , pp. 161, and 170-171 (1988).*  
International Search Report for PCT/EP2009/055577, Completed by the European Patent Office Aug. 28, 2009, 6 Pages.  
Fernandez et al. "Synthesis of Poly(vinyl butyral)s in Homogeneous Phase and Their Thermal Properties", Journal of Applied Polymer Science 2006, vol. 102, p. 5007-5017.

* cited by examiner

Primary Examiner — Alexander Kollias  
(74) Attorney, Agent, or Firm — Brooks Kushman P.C.

(57) ABSTRACT

A plasticizer-containing film of polyvinyl acetal having a softening temperature Tg of less than 74° C. contains at least one cyclohexane dicarboxylic acid ester as a plasticizer. The plasticizer-containing films have a low tendency for sweating of the plasticizer, and are useful in producing laminate safety glasses and photovoltaic modules.

22 Claims, No Drawings

POLYVINYL ACETAL FILMS CONTAINING CYCLOHEXANE-1,2-DICARBOXYLIC ACID ESTERS AS A PLASTICIZER

CROSS-REFERENCE TO RELATED APPLICATION

This application is the U.S. national phase of PCT Appln. No. PCT/EP2009/055577 filed May 8, 2009 which claims priority to German application DE 10 2008 001 655.1 filed May 8, 2008 and the benefit of U.S. Provisional Application No. 61/098,363 filed Sep. 19, 2008.

BACKGROUND OF THE INVENTION

1. Field of the Invention

Plasticizer-containing films made of polyvinyl acetal comprising cyclohexane-1,2-dicarboxylic acid esters as plasticizers The invention relates to a plasticizer-containing film that is suitable as an intermediate layer in laminate safety glasses and is based on partly acetalised polyvinyl alcohols, with the use of hydrogenated phthalate esters as plasticizers as well as to the use of the intermediate layers in composite glass laminates and photovoltaic modules.

Laminate safety glasses generally consist of two glass panels and an intermediate film connecting the glass panels. Plasticizer-containing, partly acetalised polyvinyl alcohol (polyvinyl acetal), in particular polyvinyl butyral (PVB), is predominantly used as a film material. Laminate safety glasses (LSGs) are used, for example, as windscreens or side glazings in the automobile industry and as safety glass in the construction industry.

In the meantime, aliphatic diesters of triethylene glycol or tetraethylene glycol have been established as plasticizers for PVB films of this type. 3G7, 3G8 or 4G7 are used particularly frequently as plasticizers, the first number indicating the number of ethylene glycol units and the last number indicating the number of carbon atoms in the carboxylic acid part of the compound. 3G8 therefore stands for triethylene glycol-bis-(2-ethylhexanoate), i.e. for a compound of formula 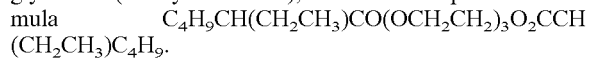 $C_4H_9CH(CH_2CH_3)CO(OCH_2CH_2)_3O_2CCH(CH_2CH_3)C_4H_9$.

Compounds that provide high transparency, low moisture absorption, good adhesion to glass and sufficient flexibility at low temperature of the film in a LSG intermediate layer film are preferably used as plasticizers for partly acetalised polyvinyl alcohols. Furthermore, these compounds must exhibit sufficient compatibility with the partly acetalised polyvinyl alcohol, i.e. they must be mixable therewith in a sufficient amount without sweating out again.

The compatibility of plasticizers and partly acetalised polyvinyl alcohol generally decreases with the polar nature of the plasticizer. Plasticizers of higher polarity are thus more compatible with polyvinyl acetal than those of lower polarity. Alternatively, the compatibility of plasticizers of low polarity increases with the degree of acetalisation, i.e., with a decrease in the number of hydroxyl groups and therefore the polarity of the polyvinyl acetal.

In EP 0877 665 B1 the slightly polar 3G8 is recommended as a plasticizer for PVB films since it renders the film product more resistant to moisture. Since moisture may permanently damage the adhesion between the adhesive film and the glass and, in extreme cases, leads to visible detachments of the film from the glass, it is desirable during production of laminate safety glass (LSG) using PVB film for the film to exhibit the greatest possible resistance to moisture.

The improved moisture resistance of PVB films that are plasticised with 3G8 is produced by the stronger nonpolar nature of this plasticizer compared to plasticizers such as 4G7 or 3G7, since an octanoic acid radical chemically constitutes the plasticizer molecule instead of a heptanoic acid radical. A further advantage of using 3G8 is its relatively low volatility that, on the one hand, counteracts depletion of the plasticizer at free edges of the LSG and, on the other hand, results in only a slight unpleasant odour being produced when processing the film to form LSG.

For these reasons the plasticizer 3G8 has become established among producers of PVB film within a short period of time.

On the one hand, the outstanding technical properties of this product are contrasted by considerably higher acquisition or production costs compared to standard plasticizers that are widespread in other branches of industry, for example the phthalate acid esters used to plasticize PVC. In addition, a further reduction in the moisture absorption of plasticised PVB film is desirable, since the longevity of laminate safety glass can thus be increased further. However, in the case of 3G8, a further reduction in moisture absorption is limited by the highly hydrophilic triethylene glycol fraction.

It is known from EP 0 877 665 B1 that PVB types having a polyvinyl alcohol content of greater than 19.5% by weight cannot be readily plasticised with 3G8 since it is expected that the plasticizer will sweat. As is the case with other plasticizer-containing plastic products, the sweating of the plasticizer is also undesirable in the case of intermediate layer films for LSG since discharge of the plasticizer, inter alia along the free edge of the PVB, may lead to premature delamination at the edge of the bond. In EP 0877 665 B1, the use of 3G8 is limited to PVB types having a polyvinyl alcohol content of 17-19.5% by weight owing to the low level of compatibility or the tendency of 3G8 to sweat.

In principle the poor compatibility of plasticizer/PVB mixtures also applies to other nonpolar plasticizers, such as dialkyl adipates having more than 6 carbon atoms in the esterifying alcohol, dialkyl sebacates having more than 4 carbon atoms in the esterifying alcohol or phthalate plasticizers, such as dioctyl phthalate or di-isononyl phthalate. Sweating of the plasticizer is observed in the case of poor compatibility, in particular during storage in humid and/or cold environments. Both conditions prevail when using PVB film in practice and are therefore relevant to assessment of plasticizer compatibility.

Rolls of PVB film are thus normally stored and transported at temperatures below 8° C. in order to avoid adhesion of adjacent film layers. In this case it is naturally undesirable for liquid plasticizer to leak out from the film during storage.

In addition, depending on the climatic conditions, laminate safety glass produced using PVB film is subjected to both low temperatures and high atmospheric humidity when installed, which may lead to a subtle, creeping loss of the plasticizer and therefore to the formation of visible defects in the form of small bubbles or detachments of the film from the glass if there is insufficient compatibility, in particular at the edges of the LSG where the PVB film is exposed.

Apart from low compatibility, plasticizers of low polarity compared to stronger polar plasticizers, such as 3G7, exhibit, in combination with a given PVB, the property of leading to reduced flexibility of the PVB film at low temperature. This is relevant, in particular, if the plasticizer content is set at less than 25% by weight and/or if the polyvinyl butyral used has a low degree of acetalisation and therefore a high residual content of polyvinyl alcohol groups. If, namely, the degree of acetalisation is too low, the softening temperature (Tg) of the PVB will be increased, which has a negative effect on the flexibility at low temperature of the plasticizer-containing film thus produced.

DE 101 16812 A1 recommends the use of derivatives of cyclohexane polycarboxylic acid esters to plasticize PVC and PVB. In this instance a mixture containing polyvinyl butyrals is disclosed, of which the fraction of free hydroxyl groups ranges from 5 to 50%. These polyvinyl butyrals exhibit a softening temperature Tg of at least 80° C. depending on the type and distribution of the cyclic acetal groups, the hydroxyl groups and the acetate groups.

The polyvinyl acetal content of the entire mixture is specified between 5 and 95% by weight, in particular between 20 and 55% by weight. Based on the plasticizer content, this corresponds to ranges of 5-95% by weight or 45-80% by weight, assuming that no further components are added.

Incompatibilities occur with higher plasticizer fractions when using PVB having a softening temperature of more than 80° C. If the plasticizer content is reduced, the film becomes less flexible at low temperature.

There was a need to formulate a PVB film using a plasticizer that is available at lower cost, effects reduced moisture absorption in the film compared to 3G8 and, in combination with partly acetalised polyvinyl alcohols exhibiting a sufficiently high degree of acetalisation, is both compatible and produces a film exhibiting a good level of flexibility at low temperature.

SUMMARY OF THE INVENTION

It has now surprisingly been found that films containing polyvinyl butyral having a low softening temperature (Tg) and softened with diesters of 1,2-cyclohexane dicarboxylic acids exhibit reduced moisture absorption compared to films containing 3G8 as a plasticizer. Films of this composition exhibit a good level of plasticizer compatibility and a good level of flexibility at low temperature.

DETAILED DESCRIPTION OF THE PREFERRED EMBODIMENTS

The invention therefore relates to a plasticizer-containing film containing 60 to 90% polyvinyl acetal, comprising a softening temperature Tg of less than 74° C., and 10 to 40% by weight (based on the total composition of the film) of at least one cyclohexane dicarboxylic acid ester having 4 to 17 C atoms in the ester group.

All the compounds disclosed in DE 101 16 812 may be used as cyclohexane dicarboxylic acid ester.

Owing to their easy accessibility, hydrogenated diesters of phthalate acid, i.e. of 1,2 cyclohexane dicarboxylic acid, are preferred plasticizers of the present invention.

In particular, ester alcohols having 9 to 17 carbon atoms are used as ester alcohols, and those having 9, 13 or 17 carbon atoms ('oxo alcohols') are particularly preferably used. These alcohols may be used in branched or unbranched form, whereby the use of largely unbranched ester alcohols produces a better plasticizing effect.

The cyclohexane dicarboxylic acid ester plasticizers used in accordance with the invention may be used in combination with at least a further apolar or polar plasticizer, also suitable as an additional plasticizer, in an amount of 1 to 40%.

The films preferably have a total plasticizer content, i.e. the content of all plasticizers in the film, ranging from 10-40% by weight, more preferably 14-32% by weight, yet more preferably 16-30% by weight, still more preferably 18-28% by weight, and in particular, 22-26% by weight. The amount of the cyclohexane dicarboxylic acid ester plasticizer used in accordance with the invention may be more than 10%, more than 20%, more than 30%, more than 40%, more than 50%, more than 60%, more than 70%, more than 80%, or more than 90%, based on this mixture.

The films may generally contain plasticizer mixtures of the cyclohexane dicarboxylic acid ester plasticizers mentioned, comprising at least one of the following plasticizers known for PVB film:

esters of multivalent aliphatic or aromatic acids, for example dialkyl adipates such as dihexyl adipate, dioctyl adipate, hexylcyclohexyl adipate, mixtures of heptyl and nonyl adipates, heptylnonyl adipate and esters of adipic acid with cycloaliphatic or ether compound-containing ester alcohols, dialkyl sebacates such as dibutyl sebacate and esters of sebacic acid with cycloaliphatic or ether compound-containing ester alcohols, or esters of phthalic acid such as butylbenzyl phthalate or bis-2-butoxyethyl phthalate, esters or ethers of multivalent aliphatic or aromatic alcohols or oligoether glycols having one or more unbranched or branched aliphatic or aromatic substituents, such as esters of di-, tri- or tetraglycols having linear or branched aliphatic or cycloaliphatic carboxylic acids; Examples of the latter group may include diethylene glycol-bis-(2-ethyl-hexanoate), triethylene glycol-bis-(2-ethyl-hexanoate); triethylene-glycol-bis-(2-ethylbutanoate); tetraethylene glycol-bis-n-heptanoate, triethylene glycol-bis-n-heptanoate, triethylene glycol-bis-n-hexanoate, tetraethylene glycol-dimethyl ether and/or dipropylene glycol benzoate.

The group of suitable additional plasticizers of high polarity includes, for example, di-(2-butoxyethyl)-adipate (DBEA), di-(2-butoxyethyl)-sebacate (DBES), di-(2-butoxyethyl)-azelate, di-(2-butoxyethyl)-glutarate, di-(2-butoxyethoxyethyl)-adipate (DBEEA), di-(2-butoxethoxyyethyl)-sebacate (DBEES), di-(2-butoxyethoxyethyl)-azelate, di-(2-butoxyethoxyethyl)-glutarate, di-(2-hexoxyethyl)-adipate, di-(2-hexoxyethyl)-sebacate, di-(2-hexoxyethyl)-azelate, di-(2-hexoxyethyl)-glutarate, di-(2-hexoxyethoxyethyl)-adipate, di-(2-hexoxyethoxyethyl)-sebacate, di-(2-hexoxyethoxyethyl)-azelate, di-(2-hexoxyethoxyethyl)-glutarate, di-(2-butoxyethyl)-phthalate and/or di-(2-butoxyethoxyethyl)-phthalate. Non-ionic surfactants may also be used.

So as not to impair the moisture resistance of the films unnecessarily by using a plasticizer that is too polar in the mixture, in particular plasticizers of low polarity can be combined with the cyclohexane dicarboxylic acid esters used in accordance with the invention. Plasticizers of low polarity include plasticizers having a polarity, calculated in accordance with the formula 100×(number of O atoms)/(number of C atoms+number of H atoms), of less than/equal to 9.4. Dialkyl adipates containing an alkyl radical having more than 6 carbon atoms and oligogycol acid esters containing a carboxylic acid radical having more than 7 carbon atoms are preferably used as plasticizers of low polarity. In particular, the following compounds are suitable:

TABLE 1

| Name | Polarity Value |
| --- | --- |
| di-2-ethylhexyl sebacate (DOS) | 5.3 |
| di-2-ethylhexyl adipate (DOA) | 6.3 |
| di-2-ethylhexyl phthalate (DOP) | 6.5 |
| triethylene glycol-bis-2-propyl hexanoate | 7.9 |
| triethylene glycol-bis-i-nonanoate | 8.6 |
| di-2-butoxyethyl sebacate (DBES) | 9.4 |
| triethylene glycol-bis-2-ethyl hexanoate (3G8) | 9.4 |

Films according to the invention may also contain further additives known to the person skilled in the art, such as residual amounts of water, UV absorbers, antioxidants, adhesion regulators, optical brightening agents, stabilizers, colorants, processing aids, organic or inorganic nanoparticles, pyrogenic silicic acid and/or surface-active substances.

By using the plasticizers or plasticizer combinations mentioned, it is possible to produce films exhibiting particularly low plasticizer discharge, which poses the advantage, during processing, of producing less of an unpleasant odour or reducing the likelihood of plasticizer aerosols being produced, and poses the advantage of increased longevity in the finished LSG.

The plasticizer discharge of the films according to the invention (as defined hereinafter) is preferably less than 4% by weight, more preferably less than 3% by weight, yet more preferably less than 2% by weight and most preferably less than 1% by weight, in each case based on the total film.

A partly acetalised or partly butyralised polyvinyl alcohol (polyvinyl butyral) with a polyvinyl acetate content (degree of acetalisation) equal to or greater than 81% by weight, more preferably greater than 82%, yet more preferably >83%, and in particular 84% or more by weight is preferably used as partly acetalised polyvinyl alcohol since these partly acetalised polyvinyl alcohols have sufficiently low softening temperatures and polarities, produce formulations that are compatible with the cyclohexane dicarboxylic acid ester plasticizers, and exhibit a good level of flexibility at low temperature. However, a degree of acetalisation of 87% by weight should not be exceeded since the mechanical properties of the film are generally no longer sufficient. In particularly preferred variants of the invention the degree of acetalisation is approx. 81%-87%, 82%-86% and 83%-85.5% by weight at 1% by weight residual acetate. At higher residual acetate contents above 1% by weight, the numerical values given for the degree of acetalisation reduce accordingly.

The sum of degree of acetalisation and residual acetate may be calculated as the remaining portion from the polyvinyl alcohol content established in accordance with ASTM D 1396 needed to make 100, i.e. the content of free hydroxyl groups of the polyvinyl acetal. The degree of acetalisation may also be established directly by high-resolution NMR spectroscopy.

In order for the films according to the invention to exhibit sufficient flexibility at low temperature with simultaneous sufficient mechanical strength at increased temperature, the polyvinyl acetals that can be used for the invention generally have softening temperatures (Tg) less than or equal to 74° C., preferably ranging from 64-74° C., more preferably 65-73° C., yet more preferably 66-72° C., and in particular ranging from 61-71° C.

In order to produce polyvinyl acetal, polyvinyl alcohol is dissolved in water and acetalised with an aldehyde, such as butyraldehyde with the addition of an acid catalyst. The polyvinyl acetal produced is separated, washed neutral, optionally suspended in an alkali aqueous medium, and then washed neutral again and dried.

The polyvinyl alcohol content of the polyvinyl acetal may be adjusted by the amount of the aldehyde used during acetalisation. It is also possible to perform the acetalisation using other or additional aldehydes having 2-10 carbon atoms (for example valeraldehyde).

The films based on plasticizer-containing polyvinyl acetal preferably contain uncrosslinked polyvinyl butyral (PVB) obtained by acetalising polyvinyl alcohol with butyraldehyde.

The use of crosslinked polyvinyl acetals, in particular crosslinked polyvinyl butyral (PVB), is also possible. Suitable crosslinked polyvinyl acetals are described for example in EP 1527107 B1 and WO 2004/063231 A1 (thermal self-crosslinking of carboxyl group-containing polyvinyl acetals), EP 1606325 A1 (polyvinyl acetals crosslinked with polyaldehydes), and WO 03/020776 A1 (polyvinyl acetals crosslinked with glyoxylic acid). The disclosure of these patent applications is fully incorporated herein by reference.

Terpolymers of hydrolysed vinyl acetate/ethylene copolymers can also be used as polyvinyl alcohol within the scope of the present invention. These compounds are normally hydrolysed to more than 98 mol % and contain 1 to 10% by weight of ethylene-based units (for example type "Exceval" from Kuraray Europe GmbH).

Copolymers hydrolysed from vinyl acetate and at least a further ethylenically unsaturated monomer may also be used as polyvinyl alcohol within the scope of the present invention.

Within the scope of the present invention the polyvinyl alcohols may be used in pure form or as a mixture of polyvinyl alcohols with different degrees of polymerization or hydrolysation.

Polyvinyl acetals contain in addition to the acetal units also units resulting from vinyl acetate and vinyl alcohol. The polyvinyl alcohol content of the partly acetalised polyvinyl alcohols used is generally between 12 and 18%, preferably between 13 and 16% and most preferably between 14 and 16%.

The residual acetate content of the polyvinyl acetals used in accordance with the invention is generally below 5% by weight, preferably below 3% by weight, more preferably below 2% by weight and in particular below 1.5% by weight or 1% by weight.

The production and composition of films based on polyvinyl acetals is described in principle for example in EP 185 863 B1, EP 1 118 258 B1, WO 02/102591 A1, EP 1 118 258 B1, or EP 387 148 B1.

The films according to the invention may be used, in particular, to produce laminate safety glasses by lamination with one or more glass panels in the manner known to the person skilled in the art. The laminate safety glasses may be used in the automobile industry, for example as windscreens, and within the field of architecture as transparent building components, or in furniture construction. The films according to the invention are also well-suited for the production of glass/film/plastic laminates, for example for providing lasting adhesion between a glass panel and a PET layer, owing to their low moisture absorption and plasticizer discharge. Two plastic panels, for example made of polycarbonate or PMMA, may also be adhered using the films according to the invention.

The films according to the invention may be used to adhere photovoltaic modules. The present invention therefore further relates to photovoltaic modules comprising a laminate of a) a transparent front covering,
b) one or more photosensitive semiconductor layers,
c) at least one plasticizer-containing film based on polyvinyl acetal, and
d) a back covering, the plasticizer-containing film containing 60 to 90% polyvinyl acetal having a softening temperature Tg of less than 74° C. and 10 to 40% by weight of at least one cyclohexane dicarboxylic acid ester having 4 to 17 C atoms in the ester group as a plasticizer.

All described variants of the plasticizer-containing film or the described variants of the cyclohexane dicarboxylic acid ester can be used for the photovoltaic modules according to the invention.

The films used according to the invention preferably exhibit, at an ambient humidity of 85% RH at 23° C., a resistivity of at least 5E+11 ohm·cm, preferably at least 1E+12 ohm·cm, more preferably at least 5E+12 ohm·cm, yet more preferably at least 1E+13 ohm·cm, and in particular at least 1E+14 ohm·cm. These values should be achieved at any point of the film, in particular in the edge region of the module.

Furthermore, the ion mobility, which might depend on the water content of the film, and hence the resistivity, can be affected by the addition of $SiO_7$, in particular pyrogenic silicic acid. The plasticizer-containing films based on polyvinyl acetal and used in accordance with the invention preferably contain 0.001 to 15% by weight, preferably 2 to 5% by weight, of $SiO_2$.

The avoidance of acid traces when producing the film material is a possibility for reducing the susceptibility to corrosion of the films used in accordance with the invention as they may affect photosensitive semiconductor layers. Films of this type are generally produced by extrusion of the plasticizer-containing polyvinyl acetals at increased temperatures, whereby the polymer material or plasticizer may undergo thermal decomposition. Furthermore, the residual acetate groups of the polyvinyl alcohol may be cleaved by diffused water, whereby ethanoic acid is released. In both cases acid traces are produced, which may attack the photosensitive semiconductor layers.

The films used in accordance with the invention preferably therefore exhibit a specific alkalinity, expressed as an alkali titre, that should be more than 5 or 10, preferably more than 15 and in particular more than 20, 30 or 40. A maximum alkali titre of 100 should not be exceeded.

As described hereinafter, the alkali titre is established by back titration of the film and can be adjusted by adding basic substances, for example metal salts of organic carboxylic acids having 1 to 15 carbon atoms, in particular alkaline salts or alkaline earth salts such as magnesium or potassium acetate. The basic compound is normally used at a concentration of 0.005 to 2% by weight, in particular 0.05 to 1% by weight, based on the entire mixture.

The lamination of the photovoltaic modules occurs by fusing the films, so that a bubble-free and waviness-free enclosure of the photosensitive semiconductor layer is obtained with the films.

In one variant of the photovoltaic modules according to the invention, the photosensitive semiconductor layers are applied to the covering d) (for example by evaporation coating, chemical vapour deposition, sputtering, or wet deposition) and bonded to the transparent front covering a) by means of a film c).

In another variant, the photosensitive semiconductor layers are applied to the transparent front covering a) and bonded to the back covering d) by means of the film c).

Alternatively, the photosensitive semiconductor layers can be embedded between two films c) and bonded to the coverings a) and d) in this manner.

The thickness of the plasticizer-containing films based on polyvinyl acetal is usually 0.38, 0.51, 0.76, 1.14, 1.52, or 2.28 mm in the case of use for photovoltaic modules.

During the lamination process, films used according to the invention fill the voids existing at the photosensitive semiconductor layers or the electrical connections thereof.

The transparent front covering a) normally consists of glass or PMMA. The back covering d) (so-called back sheet) of the photovoltaic module according to the invention can consist of glass, plastic, or metal or composites thereof, one of the supports possibly being transparent. It is also possible to design one or both of the coverings as laminated glass (i.e. as laminate made of at least two glass panels and at least one PVB film) or as insulation glass with a gas interspace. Naturally, combination of these measures is also possible.

The photosensitive semiconductor layers used in the modules do not need to have any special properties. Monocrystalline, polycrystalline, or amorphous systems can be used.

In case of thin-film solar modules, the photosensitive semiconductor layer is directly applied to a support. An encapsulation is not possible here. For this reason, the composite is assembled from a support (for example the back covering) with the photosensitive semiconductor layer and the transparent front covering using at least one sandwiched plasticizer-containing film based on polyvinyl acetal according to the invention and bonded by means of this film at an elevated temperature. Alternatively, the photosensitive semiconductor layer can be applied to the transparent front covering as support and bonded to the back covering by means of at least one sandwiched plasticizer-containing film based on polyvinyl acetal according to the invention.

For lamination of the composite thus obtained, the methods known to those skilled in the art can be used with or without prior formation of a pre-laminate.

So-called autoclave processes are performed at an elevated pressure of approximately 10 to 15 bar and temperatures of 130 to 145° C. over the course of approximately 2 hours. Vacuum bag or vacuum ring methods, for example according to EP 1 235 683 B1, operate at approximately 200 mbar and 130 to 145° C.

Vacuum laminators are preferably used for the production of the photovoltaic modules according to the invention. They consist of a heatable and evacuateable chamber, wherein laminated glasses may be laminated within 30-60 minutes. Reduced pressures of 0.01 to 300 mbar and temperatures of 100 to 200° C., in particular 130-160° C., have proven to be of value in practice.

Alternatively, a composite assembled as described above can be pressed into a module according to the invention between at least one pair of rollers at a temperature of 60 to 150° C. Installations of this kind are known for the production of laminated glasses and usually have at least one heating tunnel upstream or downstream from the first pressing apparatus in installations having two pressing apparatuses.

Photovoltaic modules according to the invention can be used as facade elements, roof surfaces, winter garden coverings, sound-insulating walls, balcony or balustrade elements, or as components of window surfaces.

Measuring Procedures

In order to determine the alkali titre, 3 to 4 g of the plasticizer-containing polyvinyl acetal film are dissolved overnight in a magnetic stirrer in 100 ml of a mixture of ethanol/THF (80:20). For this purpose 10 ml of a diluted hydrochloric acid (c=0.01 mol/liter) are added and then titrated potentiometrically with a solution of tetrabutylammonium hydroxide (TBAH) in 2-propanol (c=0.01 mol/liter) using a titroprocessor against a blank. The alkali titre is calculated as follows:

Alkali titre=ml HCl per 100 g of a sample=(consumption of TBAH blank−TBAH sample×100 by weight of the sample in g.)

The measurement of the volume resistivity of the film is performed in accordance with DIN IEC 60093 at a defined temperature and ambient humidity (23° C. and 85% RH) after the film has been conditioned for at least 24 h under these conditions. For the execution of the measurement, a plate electrode of type 302 132 from the company Fetronic GmbH and an instrument for resistivity measurement ISO-Digi 5 kV from the company Amprobe was used. The testing voltage was 2.5 kV, the wait time after application of the testing voltage until acquisition of measured data was 60 sec. In order to guarantee sufficient contact between the flat plates of the measuring electrode and the film, the surface roughness Rz of the film should not be greater than 10 mm when measuring in accordance with DIN EN ISO 4287; i.e. the original surface of the PVB film has to be smoothed by thermal reembossing prior to the resistivity measurement, if necessary.

The polyvinyl alcohol and polyvinyl alcohol acetate contents of the polyvinyl acetals were determined in accordance with ASTM D 1396-92. Analysis of the metal ion content took place by means of atomic absorption spectroscopy (AAS).

In order to determine the sweating behaviour of a PVB film at high humidity, a test strip is stored for 30 days in an atmosphere saturated with vapour. As a result of the water absorption and the therefore accompanying increase in polarity, the plasticizer can be superseded in less compatible systems, in such a way that it is discharged over time at the surface of the film as a highly visible film or in the form of drops. In the case of compatible formulations no plasticizer discharge can be established on test strips after 30 days, whereas this is often the case after just 24 h in the case of incompatible formulations. In order to adjust an atmosphere of greater relative humidity (RH), a saturated aqueous solution of copper sulphate pentahydrate is produced with a sediment in a closed vessel, for example a glass desiccator. An equilibrium moisture content of approximately 98% RH is established across this solution at 23° C.

In order to determine the sweating behaviour of a PVB film in a cold environment, a film portion measuring 30×10 cm is first conditioned at a climate of 23° C./23 RH for 24 h and is then wound into a roll, welded in a vapour-tight Alu-PE bag and stored for 1 week at a temperature of 5° C. Once the week has elapsed, the film is removed and the desired plasticizer is examined.

For example, for the production of plasticised PVB films the film mass may be homogenised, for example on a roller frame or by extrusion, in order to examine the sweating behaviour thereof.

The plasticizer discharge from the PVB film is established in experiments under conditions that are based on carrying out the process in a vacuum laminator, as is used to produce photovoltaic modules. For this purpose a circular blank having a diameter of 60 mm is cut or produced from a film/pattern, which is 0.76 mm thick, and is inserted, in a planar manner on the base, into a tared aluminium shell having a diameter of 65 mm (neoLab aluminium shell, smooth, 65 mm, product no. 2-1605, weight approximately 2.5 g). The sample is conditioned in the shell overnight at a climate of 23° C./25% RH and is then left for 30 minutes at 150° C. and 1 mbar in a vacuum drying chamber (Heraeus, model VTR 5022). Before being reweighed, the shell is again conditioned overnight at 23° C./25% RH. The established decrease in weight, based on the original weight of the film in percent, is defined as plasticizer discharge.

The determination of the softening temperature Tg of the partly acetalised polyvinyl alcohol is performed by means of differential scanning calorimetry (DSC) in accordance with DIN 53765 using a heating rate of 10 K/min in a temperature interval of −50° C.-150° C. A first heating ramp, followed by a cooling ramp, followed by a second heating ramp is used. The position of the glass transition temperature is determined from the measured curve associated with the second heating ramp in accordance with DIN 51007. The DIN midpoint (Tg DIN) is defined as intersection of a horizontal line at half step height with the measured curve. The step height is defined by the vertical distance of the two intersections of the middle tangent with the base lines of the measured curve before and after the glass transition.

The water or moisture content of the films is determined by the Karl Fischer method, in accordance with which the film was conditioned for at least 24 h at 23° C. and 85% RH.

The flexibility of the films at low temperature is assessed in a simple manner by manual comparison of DIN A4-sized film portions at a storage temperature of 5° C.

EXAMPLES

The films according to the invention featured in the examples satisfy the requirements that are normally placed on PVB films for laminate safety glass or photovoltaic modules, more specifically: high transparency or absence of cloudiness, low inherent colour, in particular low yellowness, sufficient mechanical strength, low inherent smell, possibility of reducing adhesion by adding conventional non-stick agents, good and uniform adhesive action towards glass and high volume resistivity.

Films according to the compositions shown in tables 2 to 4 were produced and their suitability in laminate safety glass or photovoltaic modules was examined. Unless otherwise indicated, all data is in % by weight, based on the total film; exception: PVOH content, based on the amount of PVB resin. Hexamoll DINCH stands for di-isononylcyclohexane-1,2-dicarboxylic acid from BASF SE, AEROSIL 130 is a commercial product from Evonik Degussa GmbH.

With reference to comparative example 1, it was verified that a polyvinyl butyral with a degree of acetalisation of 79% by weight, a PVA content of 20.0% by weight and a softening temperature of 75° C. partly discharged the DINCH again at a mixing ratio that is typical for PVB film (74% by weight PVB, 26% by weight DINCH), both in a moist atmosphere (after 30 days) or in a cold environment (after 1 week), i.e. it exhibits sweating. In addition, a film of this type exhibits only average flexibility at low temperature.

Comparative example 8 shows that a polyvinyl butyral with a degree of acetalisation of 72.5% by weight, a PVA content of 26.4% by weight and a softening temperature of 81° C. is partly discharged again with use of a relatively small amount of DINCH as plasticizer (80% by weight PVB, 20% by weight DINCH), both in a moist atmosphere (after 30 days) or in a cold environment (after 1 week), i.e. exhibits sweating. In addition, a film of this type exhibits poor flexibility at low temperature.

A comparison of examples 2 and 4 according to the invention with the comparative examples 3 and 5 (not carried out in accordance with the invention) shows that both moisture absorption and plasticizer discharge can be reduced further when using DINCH compared to the test films produced using 3G8.

Example 6 according to the invention shows that, when using a polyvinyl butyral having a degree of acetalisation of 86% by weight, a PVA content of 13.0% by weight and a softening temperature of 67° C. in a mixture containing 26% by weight Hexamoll DINCH, a film of sufficient compatibility is produced that exhibits particularly low moisture absorption and low plasticizer discharge.

Example 7 according to the invention shows that, when using a polyvinyl butyral having a degree of acetalisation of 84.7% by weight, a PVA content of 14.3% by weight and a softening temperature of 68° C. in a mixture containing 24% by weight Hexamoll DINCH with use of magnesium acetate tetrahydrate, an increased alkali titre can be set without impairing the electrical volume resistivity and without affecting the described features of sufficient compatibility and particularly low moisture absorption and plasticizer discharge.

Example 8 according to the invention shows that, when using a polyvinyl butyral having a degree of acetalisation of 84.7% by weight, a PVA content of 14.3% by weight and a softening temperature of 68° C. in a mixture containing 24% by weight Hexamoll DINCH, by adding pyrogenic $SiO_2$ and using magnesium acetate tetrahydrate, an increased alkali titre can be set and, simultaneously, the electrical volume resistivity can be increased further without considerably affecting the described features of sufficient compatibility and particularly low moisture absorption and plasticizer discharge.

Example 9 according to the invention shows that, when using a polyvinyl butyral having a degree of acetalisation of 84.7% by weight, a PVA content of 14.3% by weight and a softening temperature of 68° C. in a mixture containing 24% by weight Hexamoll DINCH, by adding pyrogenic $SiO_2$ the electrical volume resistivity can be increased further without considerably affecting the described features of sufficient compatibility and particularly low moisture absorption and plasticizer discharge.

Owing to their good insulation properties, films according to the invention are well-suited for production of photovoltaic modules. In addition, the films of examples 7 to 9 according to the invention exhibit particularly low corrosivity compared to the sensitive functional layers of photovoltaic modules owing to their increased alkalinity and/or the presence of pyrogenic $SiO_2$.

TABLE 2

| Example no.: | C1 | 2 | C3 | 4 |
|---|---|---|---|---|
| Polyvinyl butyral | 76 | 76 | 76 | 78 |
| Degree of acetalisation of the PVB | 79.0 | 84.7 | 84.7 | 82.8 |
| PVA content of the PVB | 20.0 | 14.3 | 14.3 | 16.2 |
| Softening temperature (Tg) of the PVB in ° C. | 75 | 68 | 68 | 71 |
| Hexamoll DINCH | 24 | 24 | — | 22 |
| 3G8 | — | — | 24 | — |
| Plasticizer sweating at high humidity after 30 days | yes | no | no | no |
| Plasticizer sweating at 5° C. after one week | yes | no | no | no |
| Equilibrium moisture content at 23° C./85% RH in % by weight | — | 1.6 | 1.8 | 1.8 |
| Plasticizer discharge in % | 2.0 | 0.7 | 1.5 | 1.2 |
| Electrical volume resistivity at 23° C./85% RH in Ohm · cm | — | 3.0 E14 | 2.7 E12 | 5.8 E13 |
| Flexibility at low temperature | average | good | good | Good |

TABLE 3

| Example no.: | C5 | 6 | C7 | C8 |
|---|---|---|---|---|
| Polyvinyl butyral | 78 | 74 | 73 | 80 |
| Degree of acetalisation of the PVB | 82.8 | 86.0 | 78.4 | 72.5 |
| PVA content of the PVB | 16.2 | 13.0 | 20.5 | 26.4 |
| Softening temperature (Tg) of the PVB in ° C. | 71 | 67 | 78 | 81 |
| Hexamoll DINCH | — | 26 | — | 20 |
| 3G8 | 22 | — | 27 | — |
| Plasticizer sweating at high humidity after 30 days | no | no | yes | yes |
| Plasticizer sweating at 5° C. after one week | no | no | yes | yes |
| Equilibrium moisture content at 23° C./85% RH in % by weight | 2.1 | 1.4 | 2.7 | — |
| Plasticizer discharge in % | 1.8 | 0.8 | 4.1 | — |
| Flexibility at low temperature | good | good | average | poor |

TABLE 4

| Example no.: | 7 | 8 | 9 |
|---|---|---|---|
| Polyvinyl butyral | 76 | 76 | 76 |
| Degree of acetalisation of the PVB | 84.7 | 84.7 | 84.7 |
| PVA content of the PVB | 14.3 | 14.3 | 14.3 |
| Softening temperature (Tg) of the PVB in ° C. | 68 | 68 | 68 |
| Hexamoll DINCH | 24 | 24 | 24 |
| Magnesium acetate tetrahydrate | 0.015 | 0.050 | — |
| Aerosil 130 | — | 1.5 | 1.5 |
| Plasticizer sweating at high humidity after 30 days | no | no | no |
| Plasticizer sweating at 5° C. after one week | no | no | no |
| Equilibrium moisture content at 23° C./85% RH in % by weight | 1.6 | 1.7 | 1.7 |
| Plasticizer discharge in % | 0.7 | 0.6 | 0.6 |
| Flexibility at low temperature | good | good | good |
| Alkali titre | 9 | 40 | 3 |
| Electrical volume resistivity at 23° C./85% RH in Ohm × cm | 3.2 E14 | >3.5 E14 | >3.5 E14 |

The invention claimed is:

1. A plasticizer-containing polyvinyl acetal laminating film comprising:
   a) a polyvinyl acetal polymer having a Tg less than 74° C. measured by differential scanning calorimetry in accordance with DIN 53765 with a heating rate of 10K/min over a temperature range of −50° C. to 150° C., the polyvinyl acetal having a Tg less than 74° C. present in an amount of from 60 to 90% by weight based on the weight of the plasticizer-containing polyvinyl acetal laminating film; and
   b) from 10 to 40% by weight based on the weight of the plasticizer-containing polyvinyl acetal laminating film of at least one cyclohexane dicarboxylic acid ester plasticizer having 4 to 17 C atoms in the ester groups of the at least one cyclohexane dicarboxylic acid ester plasticizer,
wherein the plasticizer-containing film is of a thickness suitable for use as a laminating film in laminated safety glass or in photovoltaic modules.

2. The plasticizer-containing polyvinyl acetal laminating film of claim 1, further comprising 1 to 40% by weight of one or more plasticizers of high polarity, selected from the group consisting of di-(2-butoxyethyl)-adipate (DBEA), di-(2-butoxyethyl)-sebacate (DBES), di-(2-butoxyethyl)-azelate, di-(2-butoxyethyl)-glutarate, di-(2-butoxyethoxyethyl)-adipate (DBEEA), di-(2-butoxethoxyyethyl)-sebacate (DBEES), di-(2-butoxyethoxyethyl)-azelate, di-(2-butoxyethoxyethyl)-glutarate, di-(2-hexoxyethyl)-adipate, di-(2-hexoxyethyl)-sebacate, di-(2-hexoxyethyl)-azelate, di-(2-hexoxyethyl)-glutarate, di-(2-hexoxyethoxyethyl)-adipate, di-(2-hexoxyethoxyethyl)-sebacate, di-(2-hexoxyethoxyethyl)-azelate, di-(2-hexoxyethoxyethyl)-glutarate, di-(2-butoxyethyl)-phthalate and di-(2-butoxyethoxyethyl)-phthalate.

3. The plasticizer-containing polyvinyl acetal laminating film of claim 1, further comprising 1 to 40% by weight of at least one compound having a polarity, calculated in accordance with the formula 100×(number of O atoms)/(number of C atoms+number of H atoms), of less than or equal to 9.4 as a further plasticizer.

4. The plasticizer-containing polyvinyl acetal laminating film of claim 1, wherein the degree of acetalisation of the polyvinyl acetate is greater than or equal to 81% by weight.

5. The plasticizer-containing polyvinyl acetal laminating film of claim 1, wherein the acetate content of the polyvinyl acetal is less than 5% by weight.

6. The plasticizer-containing polyvinyl acetal laminating film of claim 1, wherein the cyclohexane dicarboxylic acid ester plasticizer having 4 to 17 C atoms in the ester groups comprises 20 to 30% by weight of the plasticizer-containing polyvinyl acetal film.

7. The plasticizer-containing polyvinyl acetal laminating film of claim 1, having a plasticizer discharge of less than 4% by weight.

8. The plasticizer-containing polyvinyl acetal laminating film of claim 1, wherein the polyvinyl acetal is polyvinyl butyral.

9. A method of preparing a glass laminate, windscreen, or photovoltaic module, comprising including in the glass laminate, windscreen, or photovoltaic module, at least one plasticizer-containing polyvinyl acetal laminating film of claim 1.

10. A photovoltaic module, comprising a laminate of
    a) a transparent front covering,
    b) one or more photosensitive semiconductor layers,
    c) at least one plasticizer-containing polyvinyl acetal laminating film of claim 1, and
    d) a back covering.

11. The photovoltaic module of claim 10, wherein the plasticizer-containing polyvinyl acetal laminating film c) further comprises at least one metal salt of a carboxylic acid having 1 to 15 carbon atoms as a basic compound.

12. The photovoltaic module of claim 10, wherein the plasticizer-containing polyvinyl acetal laminating film contains 0.001 to 5% by weight of $SiO_2$.

13. The photovoltaic module of claim 11, wherein the plasticizer-containing polyvinyl acetal laminating film contains 0.001 to 5% by weight of $SiO_2$.

14. The photovoltaic module of claim 10, where the one or more photosensitive semiconductor layers b) are applied to the transparent front covering a) or the rear covering d) and are bonded by the at least one plasticizer-containing polyvinyl acetal laminating film c).

15. The photovoltaic module of claim 10, wherein the one or more photosensitive semiconductor layers b) are embedded between two plasticizer-containing polyvinyl acetal laminating films c) and bonded thereby to the back covering d) and front covering a).

16. The plasticizer-containing polyvinyl acetal laminating film of claim 1, having a plasticizer discharge of less than 1% by weight.

17. The plasticizer-containing polyvinyl acetal laminating film of claim 1, having a resistivity of at least $1·10^{13}$ ohm·cm measured at 85% relative humidity and 23° C.

18. The plasticizer-containing polyvinyl acetal laminating film of claim 16, having a resistivity of at least $1·10^{13}$ ohm·cm measured at 85% relative humidity and 23° C.

19. The plasticizer-containing polyvinyl acetal laminating film of claim 1, further comprising 1 to 40% by weight of a further plasticizer other than the cyclohexane dicarboxylic ester plasticizer having 4 to 17 carbon atoms in the ester group.

20. The plasticizer-containing polyvinyl acetal laminating film of claim 1, which has a thickness of from 0.38 mm to 2.28 mm.

21. The plasticizer-containing polyvinyl acetal laminating film of claim 1, in the form of a roll.

22. The plasticizer-containing polyvinyl acetal laminating film of claim 1, wherein the polyvinyl acetal polymer has a Tg of from 61° C. to less than 74° C.

* * * * *